US008499213B2

(12) United States Patent
Kim et al.

(10) Patent No.: US 8,499,213 B2
(45) Date of Patent: Jul. 30, 2013

(54) FORWARD ERROR CORRECTION ENCODING/DECODING METHOD AND APPARATUS, DIGITAL BROADCASTING RECEPTION APPARTUS, AND DECODING METHOD THEREOF

(75) Inventors: Sung-Hoon Kim, Daejeon (KR); Jin-Soo Choi, Daejeon (KR); Jin-Woo Hong, Daejeon (KR); Yongsoek Kim, Daejeon (KR); Ho-Kyoung Lee, Gyeonggi-do (KR); Jin-Woong Kim, Daejeon (KR); Chang-Joong Kim, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 213 days.

(21) Appl. No.: 12/833,542

(22) Filed: Jul. 9, 2010

(65) Prior Publication Data

US 2011/0010608 A1   Jan. 13, 2011

(30) Foreign Application Priority Data

Jul. 10, 2009   (KR) ..................... 10-2009-0063002

(51) Int. Cl.
*H03M 13/00* (2006.01)
*H04L 1/18* (2006.01)
*H04L 5/12* (2006.01)
*H04L 23/02* (2006.01)

(52) U.S. Cl.
USPC ........... 714/751; 714/752; 714/758; 375/262; 375/265

(58) Field of Classification Search
None
See application file for complete search history.

(56) References Cited

U.S. PATENT DOCUMENTS

| 6,157,642 | A  | * | 12/2000 | Sturza et al. ................ 370/389 |
| 6,594,262 | B1 | * | 7/2003  | Kwon et al. ................ 370/395.1 |
| 6,807,648 | B1 | * | 10/2004 | Cansever et al. ............. 714/776 |
| 2007/0283212 | A1 | * | 12/2007 | Nieto ........................ 714/756 |
| 2008/0052609 | A1 | * | 2/2008  | Peng et al. .................... 714/799 |

FOREIGN PATENT DOCUMENTS

| KR | 10-0735276     | 6/2007 |
| KR | 10-0736620 B1  | 7/2007 |
| KR | 1020080008928  | 1/2008 |

OTHER PUBLICATIONS

Gomez-Barquero, David et al., "Application Layer FEC for Mobile TV Delivery in IP Datacast Over DVB-H Systems," IEEE Transactions on Broadcasting, vol. 55(2):396-406 (2009).
Papaleo, Marco et al., "On the Application of MPE-FEC to Mobile DVB-S2: Performance Evaluation in Deep Fading Conditions," International Workshop on Satellite and Space Communications, IWSSC '07, vol. 13(14):223-227 (2007).
Advanced Television Systems Committee Inc., "A/53: ATSC Digital Television Standard, Parts 1-6," 135 pages (2007).
Advanced Television Systems Committee Inc., "Proposed Standard: ATSC Mobile DTV Standard, Part 2—RF/Transmission System Characteristics (A/153 Part 2:2009)," 94 pages, (2009).
Chang-Joong, Kim et al., "MPEG-2 TS Layer Forward Error Correction Code for ATSC VSB System," The Institute of Electronics Engineers of Korea, 3 pages, (2009).
Etri, "Transport Stream Layer FEC for Indoor Reception and NRT Services," Slideshow, www.etri.re.kr, 13 pages, (2009).

* cited by examiner

*Primary Examiner* — Guerrier Merant
(74) *Attorney, Agent, or Firm* — Nelson Mullins Riley & Scarborough LLP; EuiHoon Lee, Esq.

(57) ABSTRACT

A forward error correction encoding method includes: separating a first header section from an inputted packet stream; generating a second payload section by encoding a first payload section of the packet stream, from which the first header section is separated, according to a preset code rate; generating a second header section according to the code rate; and combining the first header section, the second header section, and the second payload section.

20 Claims, 7 Drawing Sheets

FORWARD ERROR CORRECTION ENCODING/DECODING METHOD AND APPARATUS, DIGITAL BROADCASTING RECEPTION APPARTUS, AND DECODING METHOD THEREOF

CROSS-REFERENCE(S) TO RELATED APPLICATIONS

The present application claims priority of Korean Patent Application No(s). 10-2009-0063002, filed on Jul. 10, 2009, which is incorporated herein by reference in its entirety.

BACKGROUND OF THE INVENTION

1. Field of the Invention

Exemplary embodiments of the present invention relate to a forward error correction (FEC) encoding/decoding method and apparatus, a digital broadcasting reception apparatus, and a decoding method thereof; and, more particularly, to a packet-level FEC encoding/decoding method and apparatus, and a digital broadcasting reception apparatus, and a decoding method thereof.

2. Description of Related Art

At present, the ATSC standard used in the United States and the DVB-Terrestrial (DVB-T) standard used in the Europe are the representative terrestrial DTV standard which is dominant in the worldwide DTV markets. The ATSC standard and the DVB standard have evolved in different ways.

The terrestrial DTV standardization for mobile broadcasting and next generation broadcasting service first began to proceed in the DVB side. As a result, the DVB-Handheld (DVB-H) standard and the DVB-2nd Generation Terrestrial (DVB-T2) standard were drafted in 2004 and 2008, respectively. Also, the standardization of DVB-NGH, which is the next generation standard of DVB-H, is in progress. During this process, the compatibility with the existing DVB-T and the DVBH standards was daringly abandoned. Thus, the remarkable technical advance becomes possible but the existing broadcasting equipment and receiver must be completely replaced for the introduction of the DVB-T2 or DVB-NGH service.

Meanwhile, after a long discussion, the ATSC Mobile DTV standard guaranteeing the compatibility with the existing ATSC standard was established in 2009 and its commercialization is in progress. Although the ATSC considers the evolution such as high transmission efficiency for next generation broadcasting service, it preferentially considers the compatibility with the existing broadcasting equipment and receiver.

The ATSC is the standardization organization for terrestrial digital TV broadcasting standard of North America. The terrestrial DTV broadcasting signal transmission standard (Document No. A/53) of the ATSC based on the VSB modulation technology, which is one of single carrier modulation scheme, was established in 1995, and the mobile DTV broadcasting signal transmission standard (Document No. A/153) was established in 2009. Also, the ATSC Planning Committee (PC)-4 is in the process of developing ATSC 2.0 for the next generation terrestrial broadcasting standardization. The ATSC 2.0 includes ATSC-Mobile/Handheld (ATSC-M/H) which guarantees the mobility. The ATSC 2.0 is being developed so that the service having the higher quality than the existing service can be provided through the same frequency channel within the range at which the existing ATSC is not influenced.

SUMMARY OF THE INVENTION

An embodiment of the present invention is directed to an FEC encoding/decoding method and apparatus, a digital broadcasting reception apparatus, and a decoding method thereof, which are capable of more effectively recovering errors caused by external noise or fading.

Another embodiment of the present invention is directed to an FEC encoding/decoding method and apparatus, a digital broadcasting reception apparatus, and a decoding method thereof, which are capable of guaranteeing the downward compatibility.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, a forward error correction encoding method includes: separating a first header section from an inputted packet stream; generating a second payload section by encoding a first payload section of the packet stream, from which the first header section is separated, according to a preset code rate; generating a second header section according to the code rate; and combining the first header section, the second header section, and the second payload section.

In accordance with another embodiment of the present invention, a forward error correction encoding apparatus includes: a header separating unit configured to separate a first header from an inputted packet stream; an encoding unit configured to generate a second payload section by encoding a first payload section of the packet stream, from which the first header section is separated, according to a preset code rate; a header generating unit configured to generate a second header section according to the code rate; and a header combining unit configured to combine the first header section, the second header section, and the second payload section.

In accordance with another embodiment of the present invention, a forward error correction decoding method includes: separating a header section from a first packet stream encoded at a preset code rate; generating a second payload section by decoding a first payload section of the packet stream from which the header section is separated; and combining the second payload section and the header section to generate a second packet stream having the same format as the first packet stream.

In accordance with another embodiment of the present invention, a forward error correction decoding apparatus includes: a header separating unit configured to separate a header section from a first packet stream encoded at a preset code rate; a decoding unit configured to generate a second payload section by decoding a first payload section of the packet stream from which the header section is separated; and a header combining unit configured to combine the second payload section and the header section to generate a second packet stream having the same format as the first packet stream.

In accordance with another embodiment of the present invention, a decoding method of a digital broadcasting reception apparatus includes: receiving a data stream decoded according to a preset decoding scheme, and performing a forward error correction decoding on the received data stream; receiving a fed-back forward-error-correction-coded packet stream, and decoding the received packet stream according to the preset decoding scheme; and processing the data stream and the packet stream according to the preset decoding scheme and the forward error correction decoding scheme, wherein the forward error correction decoding includes: separating a header section from the processed data stream; generating a second payload section by decoding a first payload section of the data stream from which the header section is separated; and combining the second payload section and the header section to generate the packet stream.

In accordance with another embodiment of the present invention, a digital broadcasting reception apparatus includes: a first decoder configured to receive a data stream decoded according to a preset decoding scheme, and perform a forward error correction decoding on the received data stream; a second decoder configured to receive a fed-back forward-error-correction-coded packet stream, and decode the received packet stream according to the preset decoding scheme; and a data processing unit configured to process the data stream and the packet stream according to the preset decoding scheme and the forward error correction decoding scheme, wherein the first decoder includes: a header separating unit configured to separate a header section from the processed data stream; a third decoder configured to generate a second payload section by decoding a first payload section of the data stream from which the header section is separated; and a header combining unit configured to combine the second payload section and the header section to generate the packet stream.

DESCRIPTION OF SPECIFIC EMBODIMENTS

Figure 1:
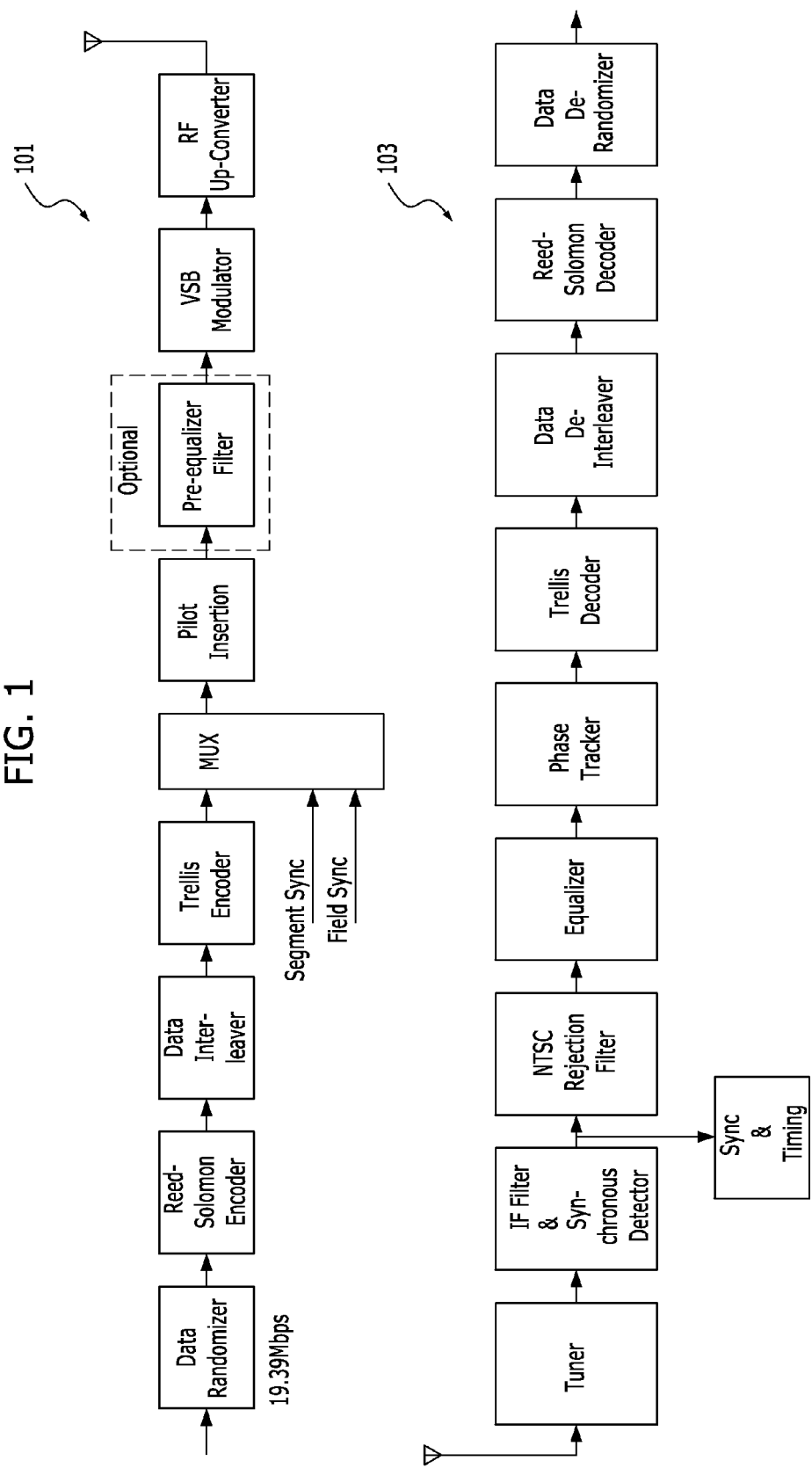
FIG. 1 is a view explaining a general digital broadcasting system using 8-VSB.

In the ATSC digital broadcasting standard (A/53), physical layer error protection methods are used for error detection and correction of main data service. In the ATSC A/53, a concatenation method using an RS code, a trellis code, and an interleaver is used as the physical layer error protection method. The concatenation method using the RS code and the trellis code is robust to a burst error as well as a random error.

However, the error protection in the physical layer may not recover long-term error which may be caused by impulse noise or fading. Therefore, there is a need for an efficient error protection method which can cope with the long-term error. To this end, a more powerful error correction code may be added to an existing physical layer error protection scheme.

Data to which the additional FEC scheme is applied may be received through a new broadcasting reception apparatus (a TV set or a set-top box) including a corresponding decoder. Such a broadcasting reception apparatus may obtain a coding gain by the additional error correction scheme.

However, if the backward compatibility is not guaranteed, an existing broadcasting reception apparatus including no decoder corresponding to the additional error correction scheme cannot receive data. On the contrary, if the additional error correction scheme guaranteeing the backward compatibility is employed, both the new broadcasting reception apparatus including the corresponding decoder and the existing broadcasting reception apparatus may be used. Thus, a differentiated service may be provided.

An FEC encoding/decoding method in accordance with an embodiment of the present invention separates the header of the packet stream and applies an encoding and decoding to a payload, thereby providing the backward compatibility. Also, the FEC encoding/decoding method in accordance with the embodiment of the present invention performs a packet-level FEC encoding and decoding, thereby improving the error correction capability and the power gain. Furthermore, overhead such as a cyclic redundancy check (CRC) code, a packet sequence number, or a code generation pattern need not be used for error correction, thereby improving the bandwidth efficiency. Moreover, a preset packet stream format may be used without multi-protocol capsulation such as IP capsulation, thereby providing the simplicity of transmission procedures.

Meanwhile, the embodiments of the present invention may be applied to a digital broadcasting system and any system which performs transmission/reception by using a packet stream including a header and a payload.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a view explaining a general digital broadcasting system using 8-VSB. The digital broadcasting system of FIG. 1 complies with the ATSC standard.

Referring to FIG. 1, the digital broadcasting system includes a digital broadcasting transmission apparatus 101 and a digital broadcasting reception apparatus 103. The description of the digital broadcasting transmission apparatus 101 will be followed by that of the digital broadcasting reception apparatus 103.

A data randomizer randomizes inputted data, and a Reed-Solomon (RS) encoder performs an FEC encoding on the randomized data. A data interleaver performs a 1/6 data field interleaving on the encoded data, and a trellis encoder performs a trellis encoding on the interleaved data at a code rate of 2/3.

After the randomization and the FEC, a multiplexer inserts a data segment sync and a data field sync into a data frame, and inserts a pilot signal. A VSB-modulated data is transmitted to the digital broadcasting reception apparatus 103.

The digital broadcasting reception apparatus 103 recovers a signal through the reverse procedures of the digital broadcasting transmission apparatus 101. That is, the digital broadcasting reception apparatus 103 recovers a signal through a signal reception, a down-conversion, a filtering, a detection, a segment/frame sync recovery, a trellis decoding, a deinterleaving, an RS decoding, and a derandomization.

Figure 2:
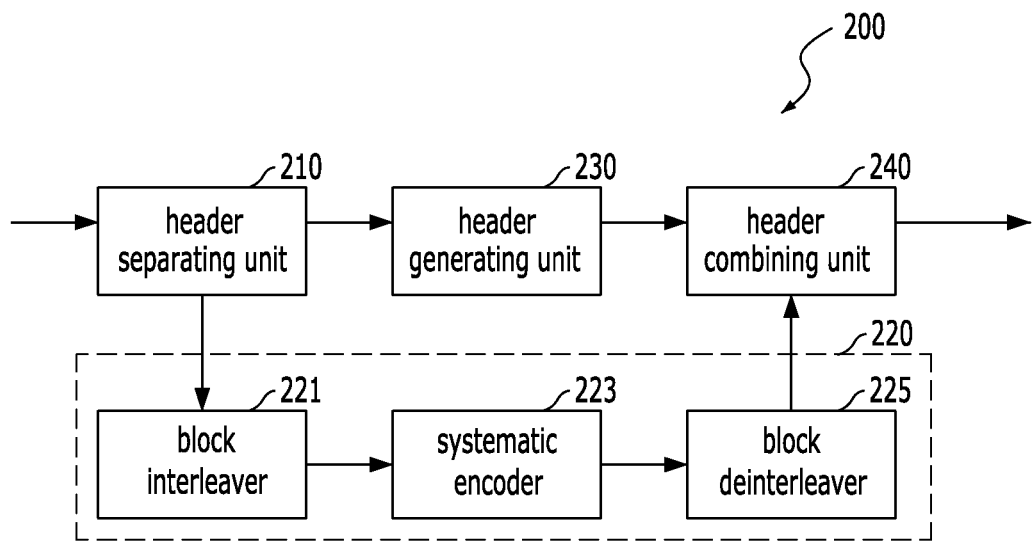
FIG. 2 is a view explaining an FEC encoding apparatus in accordance with an embodiment of the present invention.

FIG. 2 is a view explaining an FEC encoding apparatus 200 in accordance with an embodiment of the present invention. The FEC encoding apparatus 200 in accordance with the embodiment of the present invention may correct an error of inputted packet data and provide the error-corrected packet data as an input of the digital broadcasting transmission apparatus 101 of FIG. 1. In FIG. 2, a case of using an MPEG-2 transport stream (TS) packet used in an ATSC digital broadcasting will be described as one embodiment.

Referring to FIG. 2, the FEC encoding apparatus 200 in accordance with the embodiment of the present invention includes a header separating unit 210, an encoding unit 220, a header generating unit 230, and a header combining unit 240.

The header separating unit 210 separates a first header section from an inputted packet stream. That is, as described above, the packet stream includes a header and a payload, and the header removing unit 210 separates a header section and a payload section from the packet stream. An MPEG-2 TS packet is composed of 188 bytes. Of the 188 bytes, the upper 4 bytes are the header and the remaining 184 bytes are the payload.

The encoding unit 220 generates a second payload section by encoding the first payload section, in which the header is separated, at a preset code rate. For example, when the preset code rate is K/N, the encoding unit 220 receives and encodes K-byte data and outputs N-byte data. In accordance with the embodiment of the present invention, the encoding unit 220 may include a block interleaver 221, a systematic encoder 223, and a block deinterleaver 225.

The block interleaver 221 block-interleaves the first payload section separated by the header separating unit 210. For example, the block interleaver 221 block-interleaves 184*K byte data of the MPEG-2 TS according to the code rate. The systematic encoder 223 encodes the block-interleaved first payload section so that a parity packet according to the preset code rate is included therein. The block deinterleaver 225 generates a second payload section by block-deinterleaving the encoded first payload section.

At this time, the parity packet is located outside the encoded first payload section and included in the second payload section. That is, the systematic encoder 223 performs an RS encoding or a low density parity check (LDPC) encoding so that the parity packet is not mixed with the deinterleaved payload.

The header generating unit 230 generates a second header section according to the code rate. Since the encoding is performed on the payload in which the header is separated, the header may be insufficient when recombining the header and the payload. Thus, the header generating unit 230 generates an additional header. At this time, the header generating unit 230 generates the second header section including a PID (Packet ID) which represents a header generated according to the code rate in order to facilitate the decoding. That is, the header generating unit 230 may additionally generate (N-K) number of the MPEG-2 TS headers.

The header generating unit 230 may receive a total of K MPEG-2 TS packet headers. In this case, the length of the header is 4*K bytes. The header generating unit 230 may receive the header having the length of the 4*K bytes, transmit the received header to the header combining unit 240, and additionally generate (N-K) number of the MPEG-2 TS headers.

The header combining unit 240 combines the first header section, the second header section, and the second payload section. At this time, the header combining unit 240 may generate a packet stream having the same format as the packet stream inputted to the header separating unit 210 by combining the first header section, the second header section, and the second payload section. That is, the packet stream having the same format as the MPEG-2 packet stream inputted by the header combining unit 240 may be generated, and the embodiment of the present invention can be applied to a terrestrial transmission/reception system, a satellite signal transmission/reception system, and an IPTV system which use the MPEG-2 packet stream.

Figure 3:
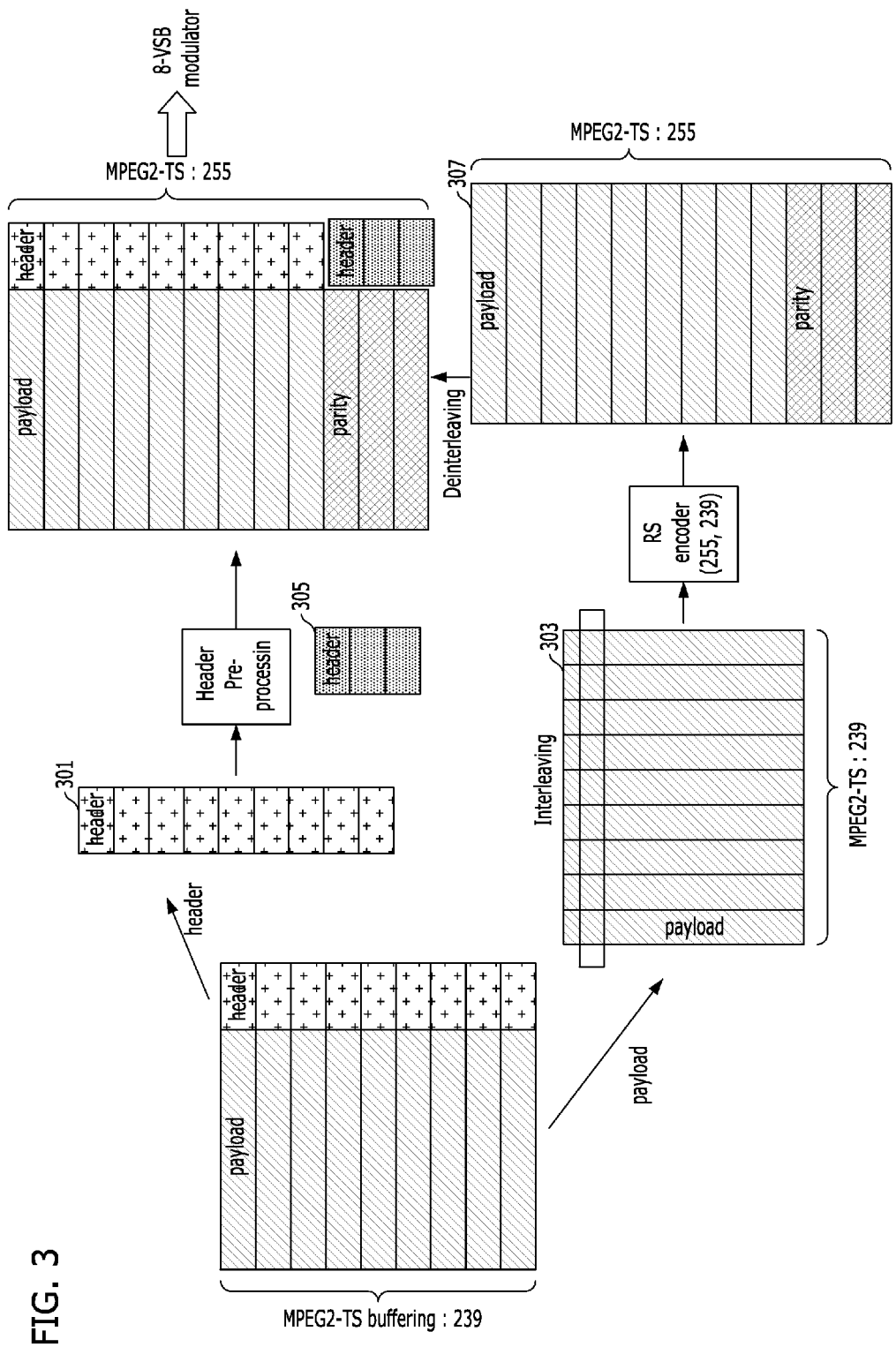
FIG. 3 is a detailed view explaining an FEC process of the FEC encoding apparatus of FIG. 2.

FIG. 3 is a detailed view explaining an FEC process of the FEC encoding apparatus 200 of FIG. 2.

The block interleaver 221 receives 184*K-byte data from the first payload section 301 obtained through the header separating unit 210, and performs an interleaving by recording the received data in a 184*K matrix column-wise and reading out the recorded data row-wise.

The block deinterleaver 225 receives N*184-byte data, and performs a deinterleaving by recording the received data in a 184*N matrix row-wise and reading out the recorded data column-wise. At this time, as described above with reference to FIG. 2, the parity packet is included in the second payload section 307 but located outside the encoded first payload section 303.

The header combining unit 240 combines the first header section 301, the second header section 305, and the second payload section 307, and generates the MPEG-2 TS packet.

Figure 4:
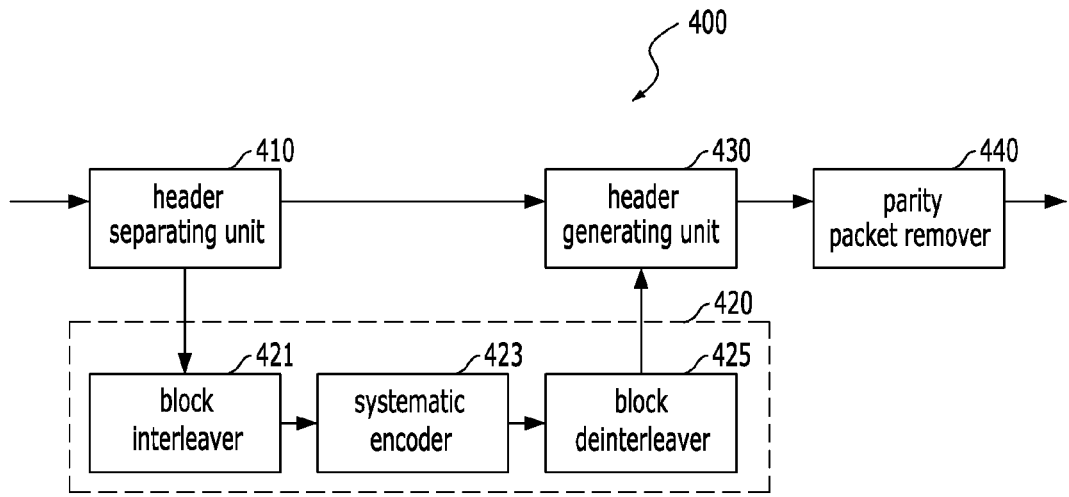
FIG. 4 is a view explaining an FEC decoding apparatus in accordance with an embodiment of the present invention.

FIG. 4 is a view explaining an FEC decoding apparatus 400 in accordance with an embodiment of the present invention.

Referring to FIG. 4, the FEC decoding apparatus 400 in accordance with the embodiment of the present invention includes a header separating unit 410, a decoding unit 420, and a header combining unit 430. The FEC decoding apparatus 400 decodes data encoded by the FEC encoding apparatus 200 of FIG. 2. Like the FEC encoding apparatus 200 which separates the header and encodes the payload, the FEC decoding apparatus 400 separates the header and decodes the payload.

The header separating unit 410 separates a header section from a first packet stream encoded at the preset code rate. The header separating unit 410 corresponds to the header separating unit 210 of FIG. 2. However, when the code rate of the FEC encoding apparatus 200 is K/N, the header separating unit 410 receives N number of TS packets as opposed to the header separating unit 210 of FIG. 2.

The decoding unit 420 generates a second payload section by decoding a first payload section of the packet stream from which the header section is separated. In accordance with the embodiment of the present invention, the decoding unit 420 may include a block interleaver 421, a systematic decoder 423, and a block deinterleaver 425.

The block interleaver 421 corresponds to the block interleaver 221 of FIG. 2. However, when the code rate of the FEC encoding apparatus 200 is K/N, the block interleaver 421 receives 184*N-byte data and performs an interleaving by recording the received data in a 184*N matrix column-wise and reading out the recorded data row-wise.

The systematic decoder 423 corresponds to the systematic encoder 223 of FIG. 2. The systematic decoder 423 performs a decoding by using the same coding scheme as that used the systematic encoder 223 of FIG. 2. However, the systematic decoder 423 may output the parity packet (byte) generated by the systematic encoder 223. Therefore, the systematic decoder 423 outputs data having the length of N*184 bytes.

The header combining unit 430 combines the second payload section and the header section and generates a second packet stream having the same format as the first packet stream. The header combining unit 430 corresponds to the header combining unit 240 of FIG. 2.

Meanwhile, the FEC decoding apparatus 400 in accordance with the embodiment of the present invention may further include a parity packet removing unit 440. The parity packet removing unit 440 removes a parity packet, which is generated according to the encoding, from the second packet stream by using PID of the parity packet. That is, as described above, the FEC encoding apparatus 200 generates the second header section including the PID according to the generation of the parity packet. Therefore, the parity packet removing unit 440 may remove the parity packet by using the PID.

Meanwhile, the parity packet removing unit 440 may not be included as a separate component of the FEC decoding apparatus 400, and the parity packet may be removed by other component of the FEC decoding apparatus 400 or an decoder using the FEC decoding apparatus 400.

Figure 5:
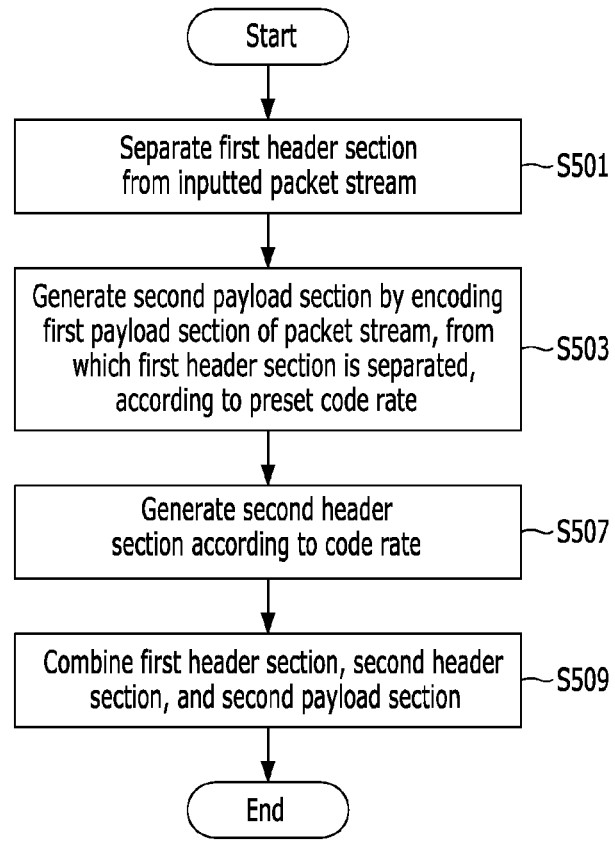
FIG. 5 is a view explaining an FEC encoding method in accordance with an embodiment of the present invention.

FIG. 5 is a view explaining an FEC encoding method in accordance with an embodiment of the present invention. In FIG. 5, an FEC encoding method of the FEC encoding apparatus 200 of FIG. 2 will be described as one embodiment.

Referring to FIG. 5, the FEC encoding method in accordance with the embodiment of the present invention starts with step S501.

At step S501, the FEC encoding apparatus 200 separates a first header section from an inputted packet stream.

At step S503, the FEC encoding apparatus 200 generates a second payload section by encoding a first payload section of the packet stream, from which the header is separated, according to the preset code rate.

More specifically, the step S503 may include: block-interleaving the first payload section; encoding the block-interleaved first payload section so that a parity packet according to the code rate is included therein; and generating a second payload section by block-deinterleaving the encoded first payload section. At this time, the parity packet is located outside the encoded first payload section and included in the second payload section. The encoding may be an RS encoding or an LDPC encoding.

At step S505, the FEC encoding apparatus 200 generates a second header section according to the code rate. At this time, the FEC encoding apparatus 200 generates the second header section including a PID which represents a header generated according to the code rate.

At step S507, the FEC encoding apparatus 200 combines the first header section, the second header section, and the second payload section. The FEC encoding apparatus 200 may generate a packet stream having the same format as the inputted packet stream by combining the first header section, the second header section, and the second payload section.

Figure 6:
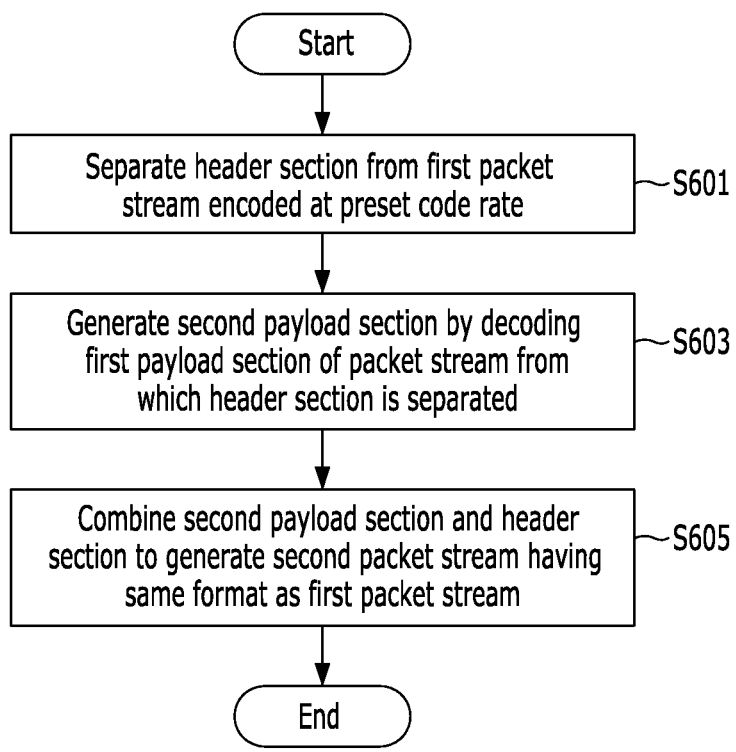
FIG. 6 is a view explaining an FEC decoding method in accordance with an embodiment of the present invention.

FIG. 6 is a view explaining an FEC decoding method in accordance with an embodiment of the present invention. In FIG. 6, an FEC decoding method of the FEC decoding apparatus 400 of FIG. 4 will be described as one embodiment.

Referring to FIG. 6, the FEC decoding method in accordance with the embodiment of the present invention starts with step S601.

At step S601, the FEC decoding apparatus 400 separates a header section from a first packet stream encoded at a preset code rate.

At step S603, the FEC decoding apparatus 400 generates a second payload section by decoding a first payload section of the packet stream from which the header section is separated. More specifically, the step S603 includes: block-interleaving the first payload; decoding the block-interleaved first payload; and generating the second payload section by block-deinterleaving the decoded first payload.

At step S605, the FEC decoding apparatus 400 combines the second payload section and the header section and generates a second packet stream having the same format as the first packet stream.

Meanwhile, the FEC decoding method in accordance with the embodiment of the present invention may further include removing a parity packet, which is generated according to the encoding, from the second packet stream by using PID of the parity packet.

Figure 7:
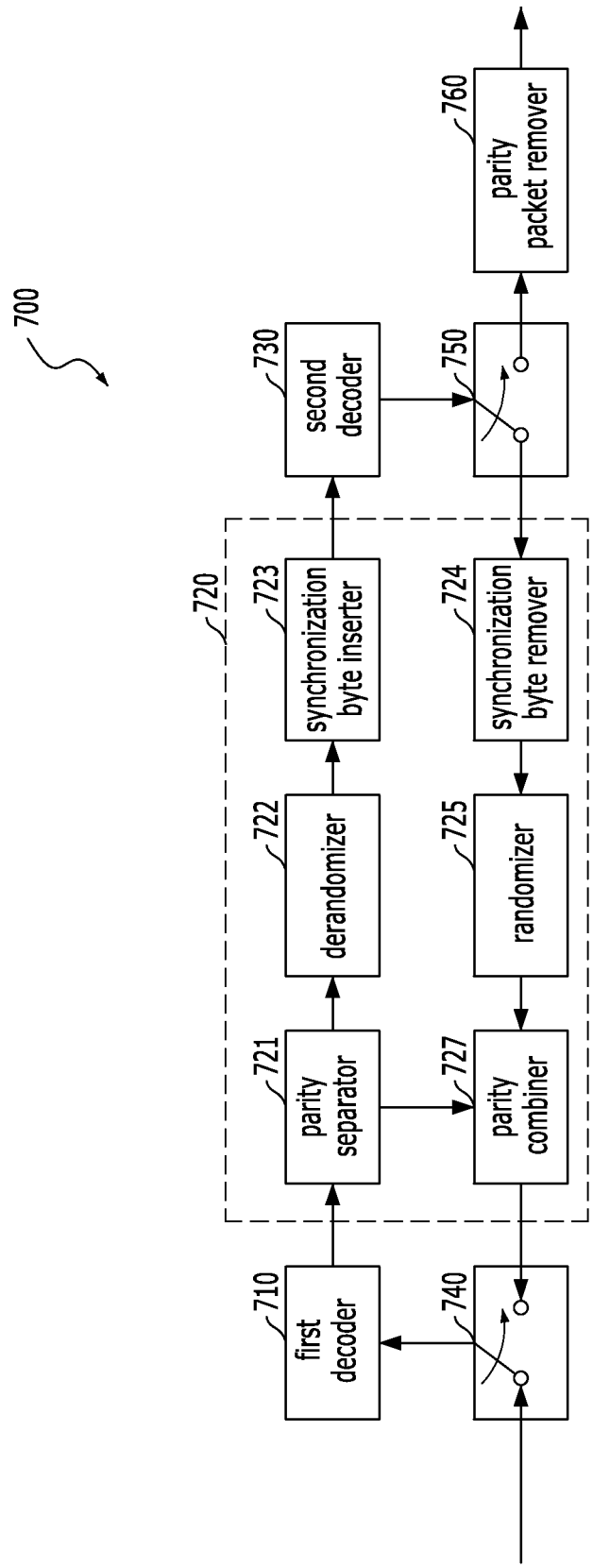
FIG. 7 is a view explaining a digital broadcasting reception apparatus in accordance with an embodiment of the present invention.

FIG. 7 is a view explaining a digital broadcasting reception apparatus 700 in accordance with an embodiment of the present invention. In FIG. 7, an ATSC digital broadcasting reception apparatus will be described as one embodiment.

Referring to FIG. 7, the digital broadcasting reception apparatus 700 in accordance with the embodiment of the present invention includes a first decoder 710, a data processing unit 720, and a second decoder 730. The digital broadcasting reception apparatus 700 performs iterative decoding. That is, data decoded by the first decoder 710 is inputted to the second decoder 730, and data decoded by the second decoder 730 is inputted to the first decoder 710. At this time, the data processing unit 720 is used to process the data decoded into a format used in the first decoder 710 and the second decoder 730. The first decoder 710 corresponds to the RS decoder of FIG. 1, and the second decoder 730 corresponds to the FEC decoding apparatus 400 of FIG. 4. The second decoder 730 may receive the output of the data derandomizer of FIG. 1.

The first decoder 710 decodes a data stream according to a preset decoding scheme. The preset decoding scheme may be a decoding scheme using RS codes 207 and 187 or BCH codes. The data stream may be a trellis-decoded and deinterleaved data stream.

The second decoder 730 receives a data stream decoded according to a preset decoding scheme, and performs an FEC decoding on the received data stream. The second decoder 730 corresponds to the FEC decoding apparatus 400 of FIG. 4. The second decoder 730 receives a data stream process by the data processing unit which will be described later.

The data processing unit 720 processes the data stream and the packet stream according to the preset decoding scheme and FEC decoding scheme. Specifically, the data processing unit 720 includes a parity separator 721, a derandomizer 722, a synchronization byte inserter 723, a synchronization byte remover 724, a randomizer 725, and a parity combiner 727.

The data processing unit 720 processes the data stream so that the second decoder 730 is enabled to perform the decoding. Specifically, the parity separator 721 separates the parity byte from the data stream. The derandomizer 722 derandomizes the data stream from which the parity byte is separated. The synchronization byte inserter 723 generates the packet stream by inserting the synchronization byte into the derandomized data stream. Specifically, the synchronization byte inserter 723 inserts a byte of 0x47, which is determined for synchronization of the MPEG-2 TS packet, in the front of the 187 bytes.

As described above, since the data inputted to the FEC decoding apparatus 400 does not include the parity byte and the FEC decoding apparatus 400 performs a packet-level decoding, the data processing unit 720 performs the above-described processes to generate the packet stream which can be used by the second decoder 730. Meanwhile, the derandomizer 722 corresponds to the derandomizer of the digital broadcasting reception apparatus 103 of FIG. 1.

Also, the data processing unit 720 processes the packet stream so that the first decoder 710 is enabled to perform the decoding. The synchronization byte remover 724 removes the synchronization byte from the packet stream. The randomizer 725 randomizes the packet stream from which the synchronization byte is removed. The parity combiner 727 generates the data stream by combining the randomized packet stream and the separated parity byte. That is, the data processing unit 720 processes the packet stream so that the first decoder 710 can use the packet stream outputted from the second decoder 730.

Meanwhile, the digital broadcasting reception apparatus 700 in accordance with the embodiment of the present invention includes a first selection unit 740 and a second selection unit 750. The first selection unit 740 and the second selection unit 750 control whether to perform the iterative decoding. The first selection unit 740 selects one of the trellis-decoded signal and the output signal of the second decoder 730, and provides the selected signal to the first decoder 710. The first selection unit 740 may control whether to perform a feedback by using the preset decoding scheme, that is, the decoding result of the first decoder 710. As the decoding result of the first decoder 710, when the decoding is failed, the first selection unit 740 may provide the signal enabling the iterative decoding to be continuously performed and the output signal of the second decoder 730 to the first decoder 710.

Under the control of the second selection unit 750, the output signal of the second decoder 730 may be provided to the parity packet remover 760. As described above, since the parity packet is used during the iterative decoding procedure, the parity packet remover 760 may not be included in the second decoder 730.

Meanwhile, a soft decision input/output decoder may be used in the first decoder 710, based on a physical layer error protection scheme used in the digital broadcasting reception apparatus 700, and the second decoder 730 of an MPEG-2 TS packet level. In this case, the first decoder 701 based on the physical layer error protection scheme need not receive the soft decision output from the trellis decoder.

Figure 8:
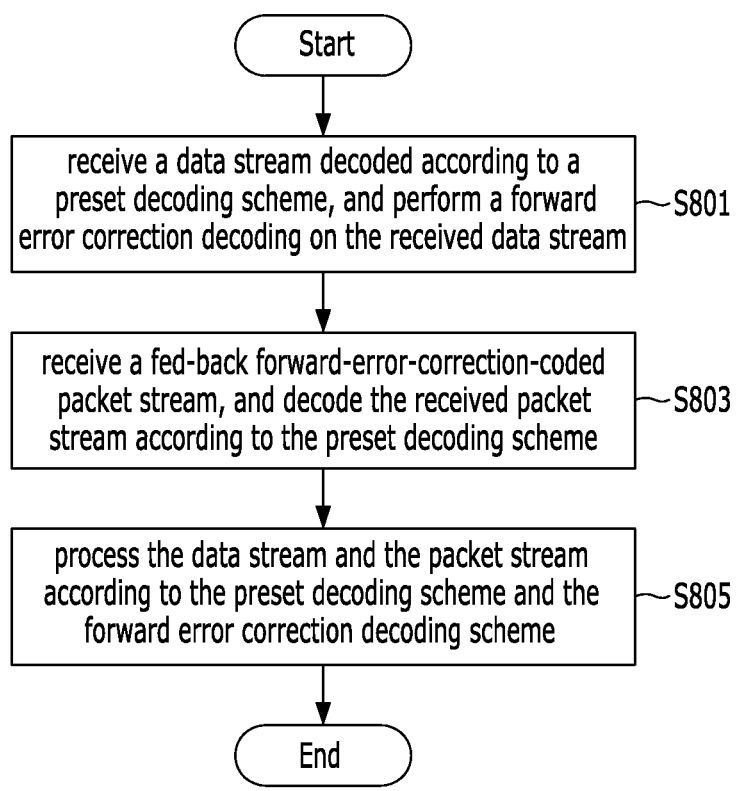
FIG. 8 is a view explaining a decoding method of a digital broadcasting reception apparatus in accordance with an embodiment of the present invention.

FIG. 8 is a view explaining a decoding method of a digital broadcasting reception apparatus in accordance with an embodiment of the present invention. In FIG. 8, a decoding method of the digital broadcasting reception apparatus of FIG. 7 will be described as one embodiment.

Referring to FIG. 8, the decoding method in accordance with the embodiment of the present invention starts with step S801.

At step S801, the digital broadcasting reception apparatus 700 receives a data stream decoded according to a preset decoding scheme, and performs an FEC decoding on the received data stream. The preset decoding scheme may be a decoding scheme using RS codes or BCH codes, and the FEC decoding is performed according to the FEC decoding method described above with reference to FIG. 5.

At step S803, the digital broadcasting reception apparatus 700 receives the fed-back FECed packet stream, and decodes the fed-back FECed packet stream according to the preset decoding scheme.

At step S805, the digital broadcasting reception apparatus 700 processes the data stream and the packet stream according to the preset decoding scheme and the FEC decoding scheme. At this time, the processing of the data stream may include: separating a parity byte from the data stream; derandomizing the data stream from which the parity byte is separated; and generating the packet stream by inserting the synchronization byte into the derandomized data stream. Also, the processing of the packet stream may include: removing the synchronization byte from the packet stream; randomizing the packet stream from which the synchronization byte is removed; and generating the data stream by combining the randomized packet stream and the separated parity byte.

Meanwhile, the decoding method of the digital broadcasting reception apparatus in accordance with the embodiment of the present invention may further include controlling whether to perform the feedback by using the decoding result according to the decoding scheme and the occurrence of the error.

In accordance with the exemplary embodiments of the present invention, the header of the packet stream is separated and the encoding and decoding are applied to the payload, thereby providing the backward compatibility and improving the error correction capability.

Also, the preset packet stream format may be used without multi-protocol capsulation such as IP capsulation, thereby providing the simplicity of transmission procedures.

Furthermore, overhead such as a cyclic redundancy check (CRC) code, a packet sequence number, or a code generation pattern is not used for error correction, thereby preventing the loss of bandwidth efficiency.

Moreover, the header of the packet stream is separated, the decoding is performed on the payload, and the general decoding of the digital broadcasting reception apparatus is iteratively performed, thereby providing the powerful error correction effect.

The FEC encoding/decoding methods and the decoding method of the digital broadcasting reception apparatus can also be embodied as computer programs. Codes and code segments constituting the programs may be easily construed by computer programmers skilled in the art to which the invention pertains. Furthermore, the created programs may be stored in computer-readable recording media or data storage media and may be read out and executed by the computers. Examples of the computer-readable recording media include any computer-readable recoding media, e.g., intangible media such as carrier waves, as well as tangible media such as CD or DVD.

While the present invention has been described with respect to the specific embodiments, it will be apparent to those skilled in the art that various changes and modifications may be made without departing from the spirit and scope of the invention as defined in the following claims.

What is claimed is:

1. A forward error correction encoding method, comprising:
separating a first header section from an inputted packet stream;
generating a second payload section by encoding a first payload section of the packet stream, from which the first header section is separated, according to a preset code rate;
generating a second header section according to the code rate; and
combining the first header section, the second header section, and the second payload section.

2. The forward error correction encoding method of claim 1, wherein said generating a second payload section comprises:
block-interleaving the first payload section;
encoding the block-interleaved first payload section so that a parity packet according to the code rate is included therein; and
generating the second payload section by block-deinterleaving the encoded first payload section.

3. The forward error correction encoding method of claim 2, wherein the parity packet is located outside the encoded first payload section and included in the second payload section and wherein the encoding is a Reed-Solomon (RS) encoding or a low density parity check (LDPC) encoding.

4. The forward error correction encoding method of claim 1, wherein the second header section comprises a PID representing a header generated according to the code rate.

5. The forward error correction encoding method of claim 1, wherein, in said combining the first header section, the second header section, and the second payload section,
the first header section, the second header section, and the second payload section are combined to generate a packet stream having the same format as the inputted packet stream.

6. The forward error correction encoding method of claim 1, wherein the packet stream comprises an MPEG-2 transport stream.

7. A forward error correction encoding apparatus comprising processing circuitry configured to define components including:
a header separating unit configured to separate a first header section and a first payload section from an inputted packet stream;
an encoding unit configured to encode the first payload section of the inputted packet stream, from which the first header section is separated, according to a preset code rate, and generate a second payload section from the encoded first payload section;
a header generating unit configured to generate a second header section for the encoded first payload according to the preset code rate; and
a header combining unit configured to combine the first header section, the second header section, and the second payload section.

8. The forward error correction encoding apparatus of claim 7, wherein the forward error correction encoding apparatus is included in a transmitter of an ATSC digital broadcasting system, and a packet stream generated by the header combining unit is inputted to a data randomizer of the transmitter.

9. A forward error correction decoding method comprising:
separating a header section and a first payload section from a first packet stream encoded at a preset code rate;
decoding the first payload section of the first packet stream, from which the header section is separated, based on the preset code rate;
generating a second payload section from the decoded first payload section;
combining the second payload section and the header section; and
generating a second packet stream having same format as the first packet stream from the combined second payload section and header section.

10. The forward error correction decoding method of claim 9, wherein said generating a second payload section comprises:
block-interleaving the first payload section;
decoding the block-interleaved first payload section; and
generating the second payload section by block-deinterleaving the decoded first payload section.

11. The forward error correction decoding method of claim 9, further comprising removing a parity packet, which is generated according to the encoding, from the second packet stream by using a PID of the parity packet.

12. The forward error correction decoding method of claim 9, wherein the packet stream comprises an MPEG-2 transport stream.

13. A forward error correction decoding apparatus comprising processing circuitry configured to define components including:
a header separating unit configured to separate a header section a first payload section from a first packet stream encoded at a preset code rate;
a decoding unit configured to decode the first payload section of the packet stream, from which the header section is separated, based on the preset code rate, and generate a second payload section from the decoded first payload section; and
a header combining unit configured to combine the second payload section and the header section, and generate a second packet stream having same format as the first packet stream from the combined second payload section and header section.

14. The forward error correction decoding apparatus of claim 13, wherein the forward error correction decoding apparatus is included in a receiver of an ATSC digital broadcasting system.

15. A decoding method of a digital broadcasting reception apparatus, the decoding method comprising:
receiving a data stream decoded according to a preset decoding scheme, and performing a forward error correction decoding on the received data stream;
receiving a fed-back forward-error-correction-coded packet stream, and decoding the received packet stream according to the preset decoding scheme; and
processing the data stream and the packet stream according to the preset decoding scheme and the forward error correction decoding scheme,
wherein the forward error correction decoding comprises:
separating a header section and a first payload section from the processed data stream;
decoding the first payload section of the processed data stream, from which the header section is separated, according to the preset decoding scheme;
generating a second payload from the decoded first payload section;
combining the second payload section and the header section; and
generating the packet stream having same format as the processed data stream from the combined second payload section and header section.

16. The decoding method of claim 15, wherein said processing the data stream comprises:
separating a parity byte of the data stream;
derandomizing the data stream from which the parity byte is separated; and
inserting a synchronization byte into the derandomized data stream to generate the packet stream.

17. The decoding method of claim 16, wherein said processing the packet stream comprises:
removing the synchronization byte from the packet stream;
randomizing the packet stream from which the synchronization byte is removed; and
combining the randomized packet stream and the separated parity byte to generate the data stream.

18. The decoding method of claim 15, wherein the preset decoding scheme is a decoding scheme using an RS code or a BCH code.

19. The decoding method of claim 15, further comprising controlling whether to feed back the forward-error-correction-coded packet stream by using a decoding result according to the preset decoding scheme.

20. A digital broadcasting reception apparatus comprising processing circuitry configured to define components including:

a first decoder configured to receive a data stream decoded according to a preset decoding scheme, and perform a forward error correction decoding on the received data stream;

a second decoder configured to receive a fed-back forward-error-correction-coded packet stream, and decode the received packet stream according to the preset decoding scheme; and a data processing unit configured to process the data stream and the packet stream according to the preset decoding scheme and the forward error correction decoding scheme, wherein the first decoder comprises:

a header separating unit configured to separate a header section and a first payload section from the processed data stream;

a third decoder configured to decode the first payload section of the processed data stream, from which the header section is separated, according to the preset decoding scheme, and generate a second payload from the decoded first payload section; and a header combining unit configured to combine the second payload section and the header section, and generate the packet stream having same format as the processed data stream from the combined second payload section and header section.

* * * * *

UNITED STATES PATENT AND TRADEMARK OFFICE
CERTIFICATE OF CORRECTION

Page 1 of 1

PATENT NO. : 8,499,213 B2
APPLICATION NO. : 12/833542
DATED : July 30, 2013
INVENTOR(S) : Sung-Hoon Kim et al.

It is certified that error appears in the above-identified patent and that said Letters Patent is hereby corrected as shown below:

On the Title Page, Item (54) and in the Specification, Column 1, lines 1-5, Title:

"FORWARD ERROR CORRECTION ENCODING/DECODING METHOD AND APPARATUS, DIGITAL BROADCASTING RECEPTION APPARTUS, AND DECODING METHOD THEREOF"

should be listed as

--FORWARD ERROR CORRECTION ENCODING/DECODING METHOD AND APPARATUS, DIGITAL BROADCASTING RECEPTION APPARATUS, AND DECODING METHOD THEREOF--

Signed and Sealed this
First Day of October, 2013

Teresa Stanek Rea
*Deputy Director of the United States Patent and Trademark Office*